(12) United States Patent
Swanson et al.

(10) Patent No.: US 8,779,376 B2
(45) Date of Patent: Jul. 15, 2014

(54) DETERMINATION OF EMISSION PARAMETERS FROM FIELD EMISSION SOURCES

(71) Applicant: FEI Company, Hillsboro, OR (US)

(72) Inventors: Lynwood W. Swanson, McMinnville, OR (US); Gregory A. Schwind, Portland, OR (US); Sean Kellogg, Portland, OR (US); Kun Liu, Portland, OR (US)

(73) Assignee: FEI Company, Hillsboro, OR (US)

( * ) Notice: Subject to any disclaimer, the term of this patent is extended or adjusted under 35 U.S.C. 154(b) by 29 days.

(21) Appl. No.: 13/648,887

(22) Filed: Oct. 10, 2012

(65) Prior Publication Data

US 2013/0187058 A1    Jul. 25, 2013

Related U.S. Application Data

(60) Provisional application No. 61/584,762, filed on Jan. 9, 2012.

(51) Int. Cl.
*G01T 1/29* (2006.01)
*H01J 37/00* (2006.01)
*H01J 37/02* (2006.01)

(52) U.S. Cl.
CPC ............... *H01J 37/00* (2013.01); *H01J 37/02* (2013.01); *H01J 2237/06316* (2013.01)
USPC .......................................... 250/393; 250/395

(58) Field of Classification Search
CPC ..................... H01J 2237/06316; H01J 37/073; H01J 2237/06341; H01J 2237/065; H01J 9/025; G01T 1/29
USPC ........................................................ 250/393
See application file for complete search history.

(56) References Cited

U.S. PATENT DOCUMENTS

| 5,993,636 | A  | * | 11/1999 | Terui et al. ..................... 205/640 |
| 2004/0238809 | A1 | * | 12/2004 | Adamec et al. .................. 257/10 |
| 2007/0158588 | A1 | * | 7/2007 | Zhou et al. .................. 250/492.2 |
| 2010/0019648 | A1 | * | 1/2010 | Yasuda et al. .................. 313/412 |

OTHER PUBLICATIONS

Bahm, A.S., et al., "Range of Validity of Field Emission Equations," J. Vac. Sci. Technol. B, Nov./Dec. 2008, pp. 2080-2084, vol. 26, No. 6.

(Continued)

*Primary Examiner* — Marcus Taningco
(74) *Attorney, Agent, or Firm* — Scheinberg & Associates, PC; Michael O. Scheinberg (57) ABSTRACT

The state of an emitter can be determined by measurements of how the current changes with the extraction voltage. A field factor β function is determined by series of relatively simple measurements of charged particles emitted at different conditions. The field factor can then be used to determine derived characteristics of the emission that, in the prior art, were difficult to determine without removing the source from the focusing column and mounting it in a specialized apparatus. The relations are determined by the source configuration and have been found to be independent of the emitter shape, and so emission character can be determined as the emitter shape changes over time, without having to determine the emitter shape and without having to redefine the relation between the field factor and the series of relatively simple measurements, and the relationships between the field factor and other emission parameters.

27 Claims, 10 Drawing Sheets

(56) References Cited

OTHER PUBLICATIONS

Bahm, A.S., et al., "The ZrO/W(100) Schottky Cathode: Morphological modification and its effect on long term operation" J. Appl. Phys., Sep. 14, 2011, 2011, p. 23, vol. 110 No. 5.

Bronsgeest, M.S., "Physics of Schottky Electron Sources Proefschrift," Delft University of Technology, Dec. 21, 2009, pp. 1-189.

Bronsgeest, M.S., et al., "Probe current, probe size, and the practical brightness for probe forming systems," J. of Vac. Sci. Technol. B, Apr. 29, 2008, pp. 949-955, vol. 26 No. 3.

Lui, K., et al., "Field induced shape and work function modification for the ZrO/W(100) Schottky Cathode," J. Vac. Sci. Technol. B, Nov. 2010, pp. C6C26-C6C33, vol. 28 No. 6.

Orloff, Jon, "Handbook of Charged Particle Optics," Jun. 25, 1997, pp. 77-102, CRC Press.

Modinos, A., 'Field, Thermionic and Secondary Electron Emission Spectroscopy,' 1984, 30 pgs. Springer.

Orloff, Jon, "Handbook of Charged Particle Optics," 2009, p. 6, CRC Press.

\* cited by examiner

DETERMINATION OF EMISSION PARAMETERS FROM FIELD EMISSION SOURCES

This application claims priority from U.S. Provisional Appl. No. 61/584,762, filed Jan. 9, 2012, which is hereby incorporated by reference.

TECHNICAL FIELD OF THE INVENTION

The present invention relates to field emission charged particle sources, and in particular, to electron sources for instruments that use electron beams.

BACKGROUND OF THE INVENTION

Electron beams are used in a variety of instruments, including electron microscopes, e-beam lithography systems, critical dimension measurement tools, and various other inspection, analysis, and processing tools. In most instruments, information about a sample is acquired by observing results of the interaction of the electron beam with the sample. In such instruments, electrons are emitted by an electron source and formed into a beam, which is focused and directed by an electron optical column. An electron source typically includes an emitter from which electrons are emitted; an extraction electrode, which extracts electrons from the emitter; and a suppressor electrode, which suppresses unwanted emission of electrons away from the emitter tip. An ideal electron source produces electrons that can be focused to a nanometer or sub-nanometer scale spot, with sufficient electron current to provide rapid, consistent data collection or electron beam processing. Such an electron source is typically characterized by having a low energy spread among the emitted electrons, high brightness, and long-term stability. Low energy spread reduces chromatic aberration of the beam in the electron column because chromatic aberration is caused by electrons having different energies being focused to different points.

To be freed from a solid surface, an electron must overcome an energy barrier. The height of this energy barrier is referred to as the "work function" of the material. Electron sources can use different types of emitters, which use different methods to overcome the work function. A "thermionic emitter" is heated by a filament to provide the electrons with sufficient thermal energy to overcome the energy barrier and leave the surface. A "field emitter" relies at least in part on an electric field to pull electrons from the source.

A "cold field emitter" uses an electric field to provide the conditions for electrons to tunnel through the energy barrier, rather than providing the electrons with sufficient thermal energy to pass over the barrier. "Schottky emitter" ("SE"), uses a combination of coating materials that lower the work function, heat to provide thermal energy, and an electric field to free the electrons. SEs typically operate at about 1,800 Kelvins. The Schottky electron source has become the most widely used source in electron optical systems where high brightness and/or small energy spread is required. Another type of emitter, a "thermal field emitter" typically operates at a higher temperature than an SE and operates similar to a cold field emitter but only at high temperatures for increased emission stability.

Figure 1A:
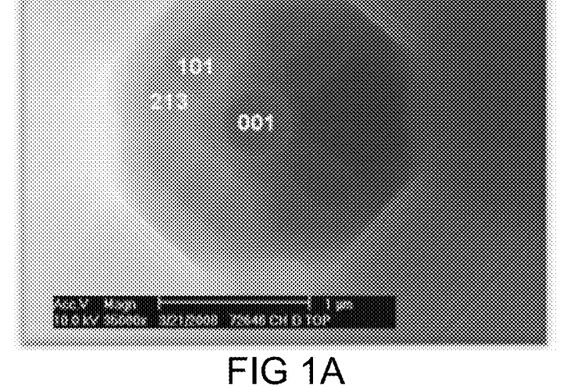
FIGS. 1A-1C show emitter end forms that a typical electron emitter will assume during its useful life.
Figure 1B:
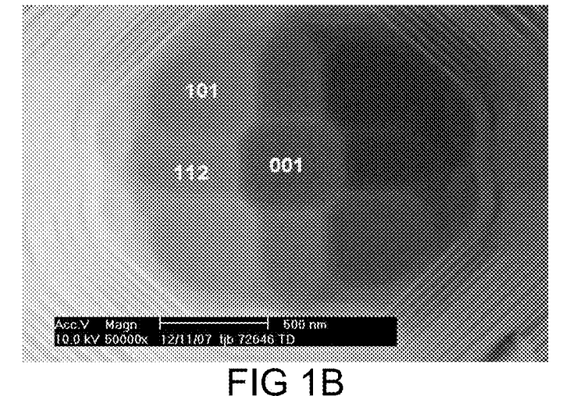
Figure 1C:
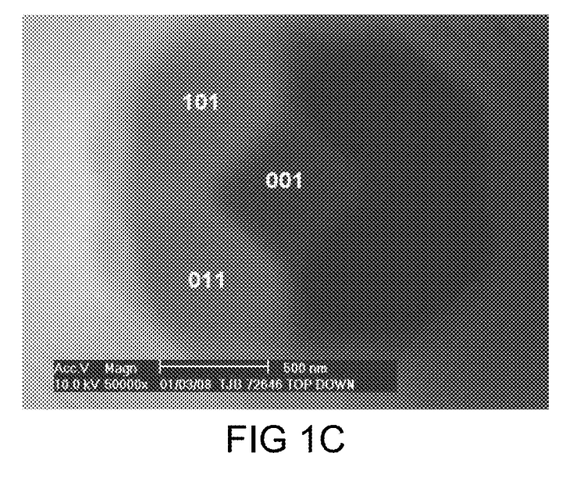

The high electric fields and/or high temperature during emitter operation results in changes to the emitter shape over time. FIGS. 1A-1C show a variety of emitter shapes or "end forms." The emitter likely will assume all three of these end-forms during a typical life span of 1-3 years. The emitter end forms are referred to as Stage 0 (FIG. 1A), Stage 1 (FIG. 1B) and Stage 2 (FIG. 1C). The different crystal facets shown in FIG. 1 grow or shrink, causing the overall morphology of the endform to the change, which in turn causes the field for a given extraction voltage to change, and hence the emission characteristics change.

Emission characteristics of an electron source can be determined by removing the source from the column and installing it in specifically designed, expensive test equipment. It is not currently practical for an operator to determine characteristics of a source "in situ," that is, with the source mounted in a focusing column, such as in a scanning electron microscope ("SEM") or transmission electron microscope ("TEM"). Currently available in-situ techniques entail complex procedures beyond the skill of most instrument operators. For example, one currently available method for inferring source brightness in an SEM entails operating the column in virtual source size limited mode and measuring the spot size. This technique depends on the ability of the system operator to align the column to obtain the best spot size and then to make a proper measurement. Because there is no accurate method to evaluate the state of the SE in-situ, emitters are often removed pre-maturely at significant cost for parts and down time for the instrument.

Current knowledge in the field of Schottky emitter is described in part in the following references:

Liu et al., "Field induced shape and work function modification for the ZrO/W(100) Schottky Cathode," J. Vac. Sci. Technol. B 28 (6) pp. C6C26-33 (2010).

Bahm et al., "Range of Validity of Field Emission Equations," J. Vac. Sci. Technol. B 26 (6) pp. 2080-2084 (2008).

M. S. Bronsgeest, "Fundamentals of Schottky Emission," http://tnw.tudelft.nl/index.php?id=33723&L=1, Delft University of Technology Bronsgeest et al., "Probe current, probe size, and the practical brightness for probe forming Systems," J. Vac. Sci. Technol. B 26 (3) pp. 949-955 (2008).

Handbook of Charged Particle Optics, $2^{nd}$ edition, J. Orloff editor, CRC Press (2008)

Modinos, Field, Thermionic, and Secondary Electron Emission Spectroscopy (Plenum Press, N.Y., 1984).

Bahm, et al, J. Appl. Phys. 110 (2011) 054322

SUMMARY OF THE INVENTION

An object of the invention is to simplify the determination of emission characteristics of a field emission source.

In accordance with an embodiment of the invention, characteristics of an emitter can be determined by relatively simple measurements that can be performed by an operator.

Applicants have found that the mathematical relationship between the series of relatively simple measurements and the emitter characteristics depends on the source geometry and is independent of the shape of the emitter. Thus, the relationships can be derived for a particular source geometry and then can be applied to determine emission characteristics even as the emitter shape changes over time, without having to determine the emitter shape and without having to redefine the relation.

In some embodiments, angular intensity is measured as a function of the extraction voltage. A field factor beta ($\beta$) is determined from the measured data. The field factor can then be used with the measured data to derive emission characteristics, such as energy spread, virtual source size, and brightness, that in the prior art were difficult to determine without removing the source from the focusing column and mounting it in a specialized apparatus. The emission characteristics can preferably be determined "in situ," that is, without removing the electron source from the instrument in which it is mounted for use.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

In a preferred embodiment, an instrument operator can perform relatively simple measurements and from those simple measurements determine characteristics of an electron source. In the prior art, some of those source characteristics could not be determined while the source was mounted in an instrument, while other source characteristics could only be determined using a time-consuming series of complex measurements. The simple measurements in accordance with the present invention can be performed in some embodiments without removing the emitter from the focusing column in which it is mounted. Embodiments of the invention provide higher accuracy and reflect the true emission characteristics better than prior art methods.

In some embodiments, relationships between the user measurements and the derived source characteristics are empirically determined, for example, by fitting curves to data determined for a particular source geometry. "Empirically determined" can include actually extracting and measuring charged particles from a source and/or computer modeling and simulation of extracting charged particles. By "source geometry" is meant, for example, the geometrical relationship between the emitter, the extractor and the suppressor, as opposed to the shape of the emitter tip. Applicants have found that the relationships between the simple measurements and the source characteristics remain constant as the emitter tip changes shape during operation, thereby allowing the relationships to be determined once for the source geometry, and then used to characterize the emitter as the emitter changes over time.

The relationship between the measured parameters and the source characteristics are typically written as equations that include constants, which depend on the source geometry. Once the constants have been determined for a particular source geometry, they do not change as the emitter changes shape over time.

In some embodiments, an operator accurately determines all important emitter characteristics from a simple set of current-voltage measurements, which is relatively easy to obtain in situ in an electron focusing system, such as an SEM or TEM, or in a test system. Determining the source characteristics in accordance with embodiments of the invention does not typically require elaborate measurement equipment or knowledge of the emitter end form.

In some embodiments, the empirical relationships can be derived through a combination of numerical data and experimental work for all practical shapes and sizes of Emitters—all that is needed to determine emission characteristics from the different shapes/sizes is an accurate value of a field factor $\beta$, which is the ratio of the electric field at the emitter to the extraction voltage V. $\beta$ can be obtained as described below from the current-voltage (I-V) measurement data.

In embodiments described below, the combination of various formulas and numerically generated data allows a person to accurately determine emitter characteristics such as virtual source size, energy spread, and brightness using I-V data, which are easily measured, or derivable from easily measured data, using a source mounted in a charged particle beam system.

In-situ source characterization provides a way for an operator to readily determine the operating condition of an electron source. This can reduce customer cost of ownership and field service costs. For example, the information can be used to determine when a source will need to be replaced and to schedule the maintenance at a convenient time. Embodiments of the invention can also be used to evaluate new electron source and column designs, providing quick feedback to the designer and reducing time to market of new electron sources and columns.

In addition, the source characteristics determined using embodiments of the invention can be used as a feedback mechanism to adjust the column operation to maximize performance over its lifetime or to schedule maintenance. For example, as the energy spread of the electrons emitted from the source changes over time, the focusing lenses of an electron column could be changed to compensate for the increased chromatic aberration, such as by reducing the focal length. If the energy spread is determined to have increased, then the angular intensity can be reduced to compensate, for example, by reducing the extraction voltage, to reduce the spot size.

Several of the equations used in this solution are well known in the electron source field and the concept of calculating the intrinsic virtual source size has been published, for example, in L. W. Swanson and G. A. Schwind, *Handbook of Charged Particle Optics* (CRC Press, Boca Raton Fla.), J. Orloff ed., (2008).

In some embodiments, source parameters, such as the virtual source size, $d_v$, and total energy distribution, TED, for the SE source are determined by computer modeling. Since the dimensional ratio of the emitter apex to the surrounding electrode region is large, a commercial charge density boundary element method program can be used to evaluate the source geometry. Such a method allows the density of cells describing the surface to vary significantly, thereby allowing a greater density at the emitter apex than at the distant extractor electrode. In addition to the surface charge density, the electric field F normal to the surface can be calculated which, in turn, will allow trajectories of emitted electrons to be calculated along with the TED and $d_v$. These calculations may be performed both with and without mutual coulomb interactions included. The ratio of $I'/J=K^2$ can thus also computed, where I' is the axial current per unit solid angle (angular intensity) and J is the axial current density at the emission surface, also called emission current density. The expression K, which has units of length, quantifies the lens action of the entire source region including the emitter, suppressor, and the extractor. Such a boundary element method program allows for distinction among the three major equilibrium faceted shapes of the SE shown in the FIG. 1 top down photos. In some instances the Stage 0 end form will be separated into either a Stage 0-a or 0-b depending on whether the four side (110) planes intersect the rounded, central (100) plane. The axial value of field factor $\beta=F/V_{ext}$ (where F and $V_{ext}$ are the applied field and extraction voltage, respectively) has been found to follow a power law dependence on K as K is varied from 1350 to 3350 nm. The latter relationship holds regardless of the emitter end form as observed in FIG. 3 and allows for the accurate conversion of experimental I' values to J at the emitter surface.

Figure 3:
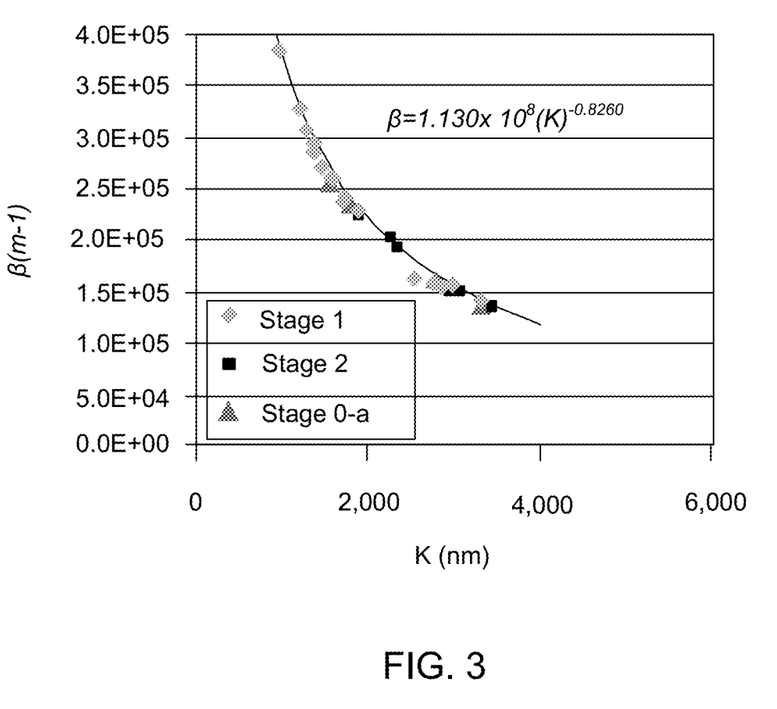
FIG. 3 shows a plot of the field factor $\beta$ versus K, the square root of the ratio of angular intensity to current density at the emission surface.
Figure 4:
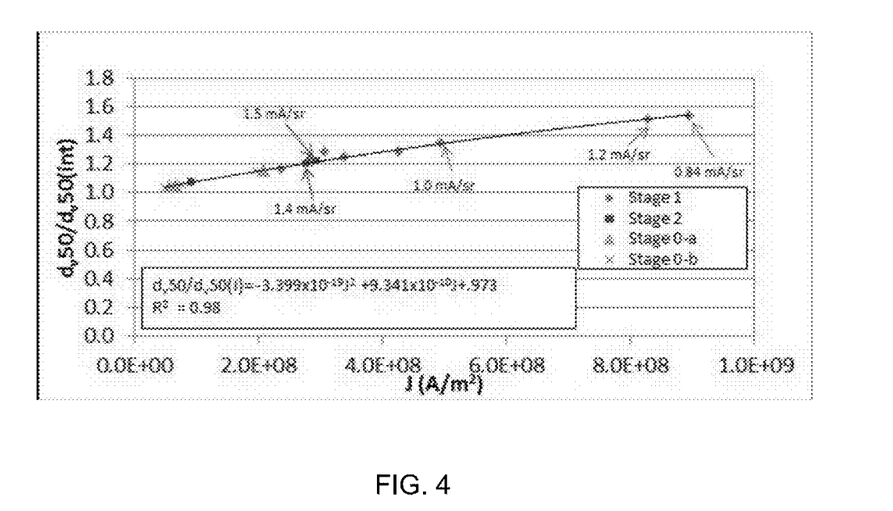
FIG. 4 shows a plot of the ratio of the intrinsic source diameter to the corrected source diameter as a function of current density.
Figure 5:
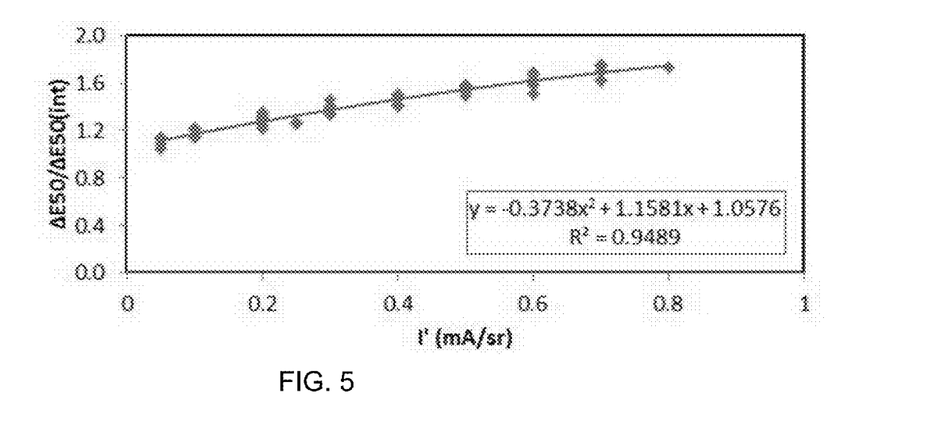
FIG. 5 shows a plot of the ratio of the intrinsic energy spread to the corrected energy spread as a function of angular intensity.

The computed values of the axial $d_v$ (with coulomb interactions) normalized by the intrinsic $d_v$(int) (without coulomb interactions) are shown in FIG. 4 for the same emitter data set given in FIG. 3 and for I' values from 0.25 to 1.0 mA/sr. A linear relationship with J is observed for $d_v/d_v$(int) independent of the stage end form. Similarly the values of the TED curves containing 50% of the current ($\Delta_E$) normalized by the $\Delta_E$(int) values are shown in FIG. 5. In this case experimental values are shown which are supported by the computed values. The data can be fit to a 2nd order polynomial with reasonable accuracy—again the relationship is neither altered by the various end form stages nor wide-ranging K values, which vary from 1100 to 4500 nm. It is interesting to note from FIGS. 4 and 5 that at I'≈0.5 mA/sr the mutual coulomb interactions have increased $d_v$ over its intrinsic value by 15% whereas the $\Delta_E$ value has increased by 50%.

Another computer program using the experimental $I'(V_{ext})$ data along with the FIG. 3 β(K) relationship calculates the emitter work function (φ) and β values. With values of K, φ, and F one can determine $\Delta_E$(int) and $d_v$(int) which along with the empirical relationships in FIGS. 4 and 5 allows the more realistic $d_v$ and $\Delta_E$ values with mutual coulomb interactions to be calculated for a given I' value. In addition, the reduced brightness ($B_r$) can be determined from $B_r=4I'/\pi d_v^2 V_{ext}=1.44J/\pi kT$ where k is the Boltzmann constant and T is the temperature of the emitter. However it should be pointed out that, in contrast to the $\Delta_E$ values, $d_v$ has a dependence on the distance from the emitter, so for electron optical applications it matters in which plane it is calculated. The applicants have adopted the convention that the measuring plane for $d_v$ is located 3 mm downstream from the emitter.

Figure 9:
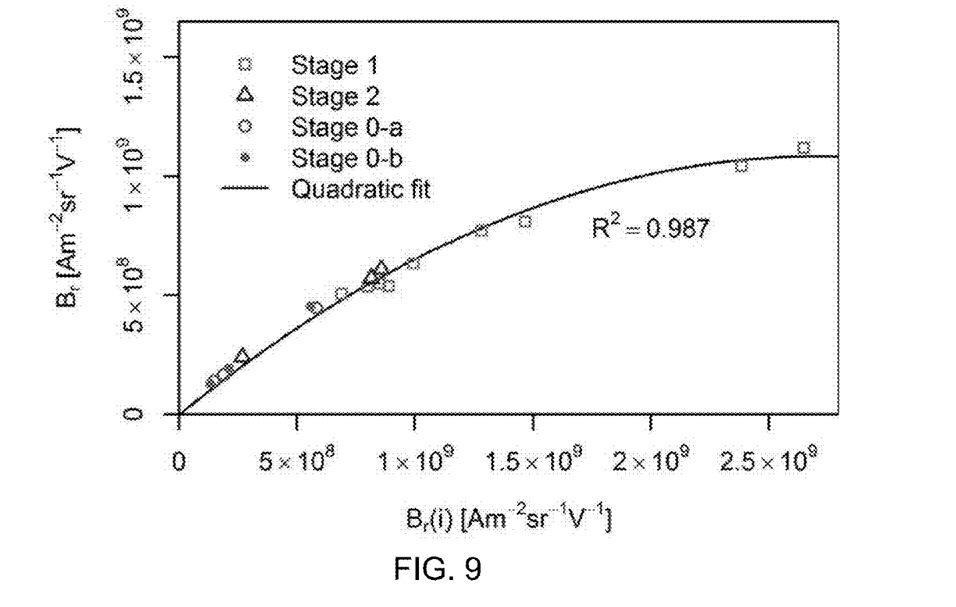
FIG. 9 shows a plot of the reduced brightness Br versus the intrinsic Br(int) without Coulomb interactions.

Separately, the applicants have found that the $B_r$ itself obeys a simple $2^{nd}$ order polynomial dependence upon the intrinsic reduced brightness $B_r$(int). FIG. 9 is a chart showing the dependence of $B_r$ on $B_r$(int) where $B_r$(int)=1.44 J/πkT is the reduced brightness in absence of Coulomb interactions. The determination of the realistic $d_v$ can thence be computed using the relationship between brightness and source size $B_r=4I'/(\pi d_v^2 V_{ext})$.

Figure 2A:
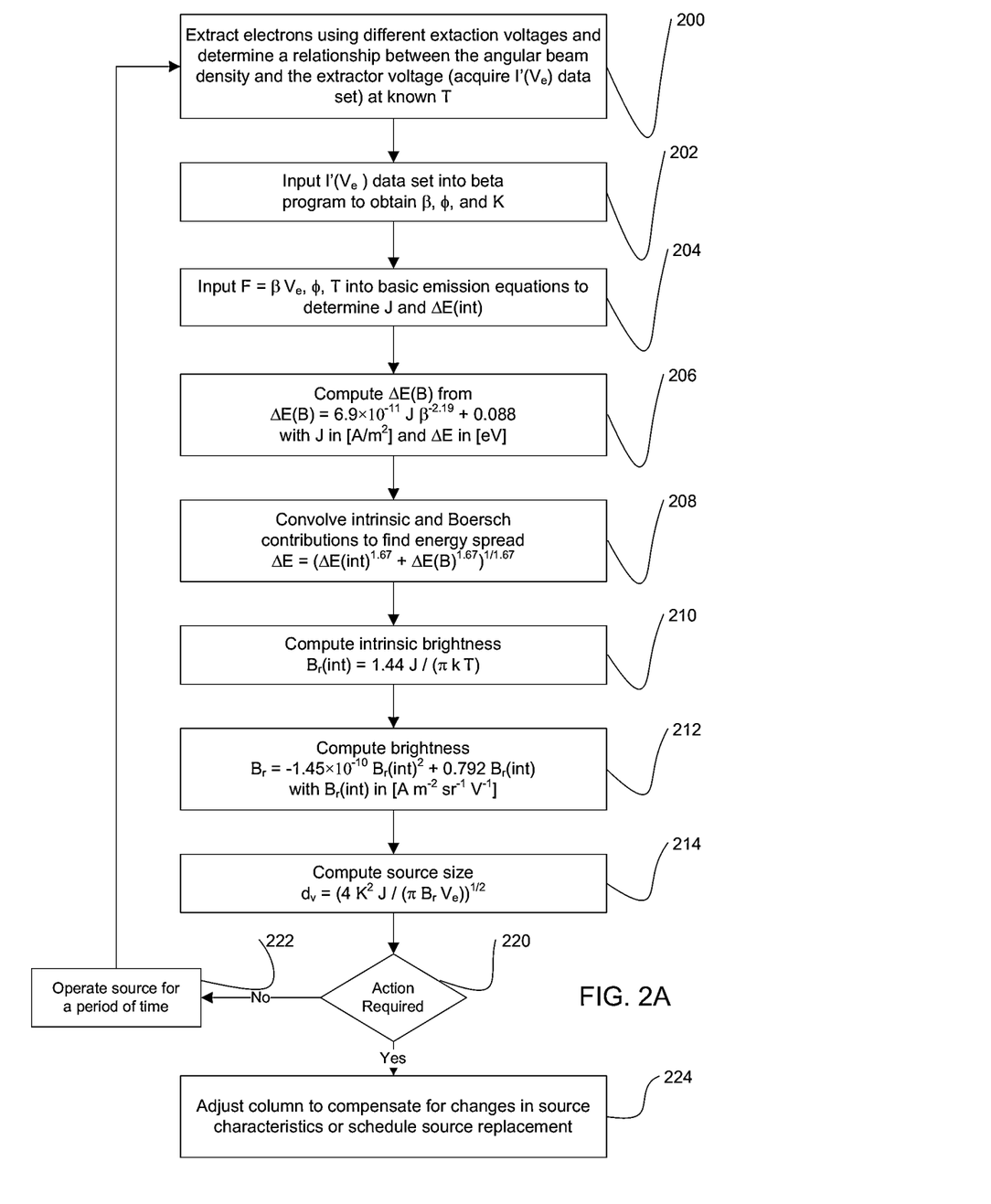
FIGS. 2A-2C show a trio of methods for determining emitter characteristics.
Figure 2B:
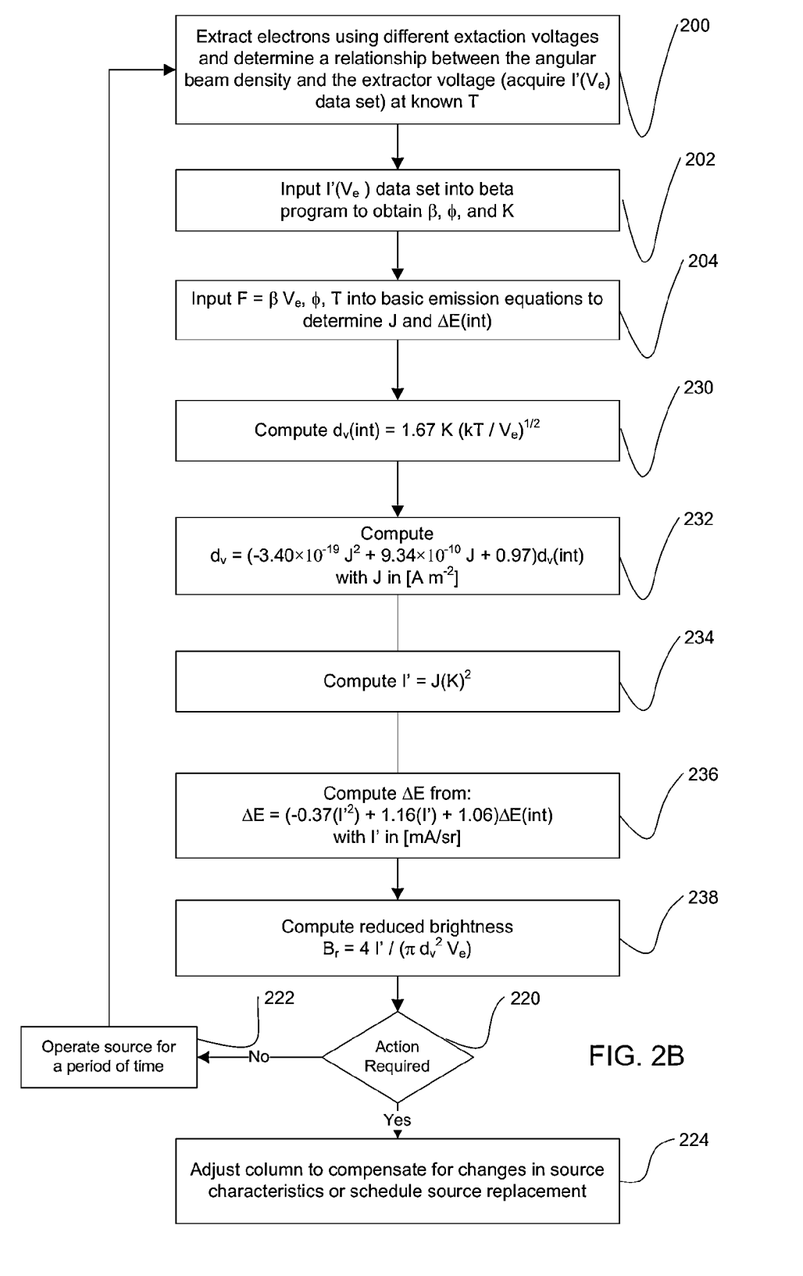
Figure 2C:
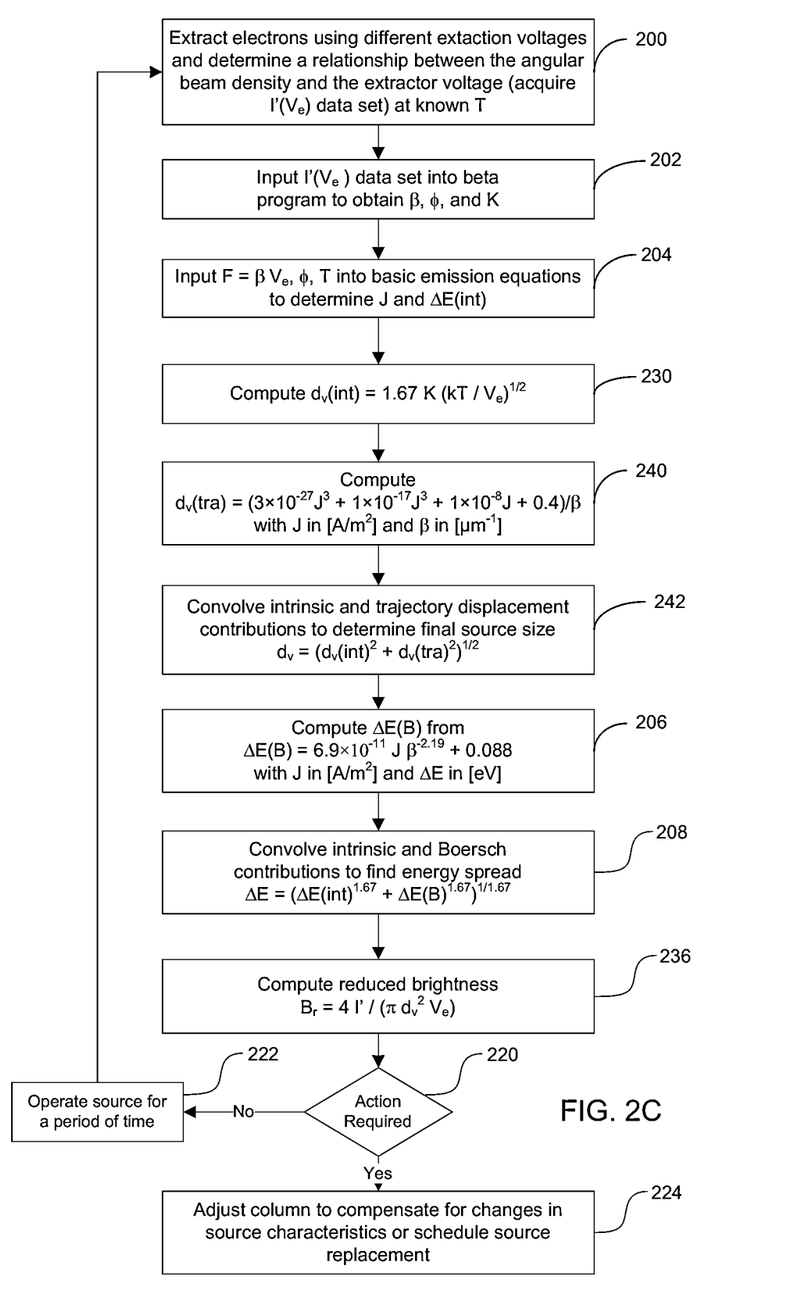

FIGS. 2A, 2B, and 2C are flowcharts showing the steps for determining emitter characteristics of a field emission source. Persons skilled in the art will recognize that each of the flowcharts is a different embodiment of the invention described herein. In the discussion below, the term "intrinsic" refers to a parameter that is not corrected for Coulombic interactions between electrons in the beam. The term "corrected" refers to parameters that have been corrected for Coulombic interactions.

The flowchart in FIG. 2A shows a preferred embodiment of the invention. In step 200, electrons are extracted from the source using multiple different extraction voltages to determine a relationship between the extraction voltage and the angular intensity, that is, current density per unit solid angle. The angular intensity is determined, for example, by passing a beam through a known aperture at a known distance to the emitter and measuring the current, for example, by directing the beam into an electrode such as a Faraday cup. The measured angular intensities are plotted against the extraction voltages and a relationship is determined by fitting an equation to the resultant curve. The curve is referred to as an I' ($V_{ext}$) curve, and the measurements are also variously referred to as I/V data or I-V data. If a suppressor electrode is used, the voltage on the suppressor electrode can be held constant as the extraction voltage is varied or, more preferably, the suppressor voltage is varied in concert with the extraction voltage so that the ratio of the suppressor to extraction voltage is kept constant at all points. Keeping the voltage ratio constant will ensure that K is preserved from one measurement to the next. The measurement can be performed without removing the source from the electron column, or the measurement can be performed outside of the electron beam column using an apparatus such as that described in Liu et al., "Field induced shape and work function modification for the ZrO/W(100) Schottky Cathode," J. Vac. Sci. Technol. B 28 (6) pp. C6C26-33 (2010). If the measurement is performed with the source "in situ" in a column, skilled persons will understand that it may be necessary to change the lens strength of one or more lenses if the current is measured at the bottom of the column to prevent unintended current loss in the column between the source and the current measuring device. Some electron microscopes have a location where current can be measured in the upper portion of the column.

Embodiments of the invention provide a way to determine the emission energy spread, $\Delta_E$, of the electrons from the emitter. Energy spread is an important parameter for characterizing the emitter because the energy spread affects the chromatic aberration and the spot size in an optical system such as an electron microscope. One measure of energy spread is FWHM, that is, the width of an energy curve between points on either side of the peak that are at one half of the curve's maximum height. A preferred measure of the energy spread is FW50, that is, the width of the narrowest energy interval which contains exactly half of the total current.

$\Delta_E$ is preferably calculated using the electric field rather than the extractor voltage, and the current density J, rather than the angular intensity. To derive $\Delta_E$ from the I' ($V_{ext}$) data, it is therefore required, in some embodiments, to determine an electric field from an extractor voltage and a current density from the angular intensity. As described above, the field factor β can be used to relate the extractor voltage to an electric field.

In step 202, the I' ($V_{ext}$) curve is input into a program to determine additional characteristics of the emitter. The program determines the field factor β, the work function (φ), and K, from the I' ($V_{ext}$) curve. These determinations can be accomplished by a variety of methods, which are described in more detail below.

In some embodiments, the field factor can be determined from the slope of plots of ln(I') versus $V_{ext}^{1/2}$ as described, for example, in L. W. Swanson et al, *Handbook of Charged Particle Optics*, J. Orloff ed., (2008). A sharp emitter will have a large field factor β—a rounded emitter will have a smaller field factor β. The field factor β is also affected by other factors that affect the electric field, such as the configuration of elements around the emitter, including the distance between the emitter and the extractor. Once the field factor dependence on K, β(K), is determined for a particular source geometry, it can be used to obtain useful emission parameters, regardless of how the emitter shape changes. It had been previously thought that different equations with different constants would be required to relate emission characteristics as the emitter passed through the known emitter stages of FIG. 1. This would necessitate determining a different relationship for each emitter shape, and then determining the emitter shape in order to determine which relation to use to characterize the emitter. Applicants found, unexpectedly, that the relationships are relatively independent of the emitter shape.

The field factor can also be calculated from a I'($V_{ext}$) curve using a curve fitting routine that fits the experimental data to theoretical data derived from basic field principles. The curve fitting program finds the electric field at the source that produces the best match for the measured I'($V_{ext}$) curve.

One preferred program for determining β for a specific source geometry includes comparing the value of J calculated from basic principles as described above, to the experimentally determined J, where J=I'/$K^2$ for a hypothetical value of K. β and the work function, which are used in determining a hypothetical value for each of K, J, and F, are then varied until agreement is achieved between experimental values and the calculated values for all the points in the experimentally acquired I' vs. $V_{ext}$ data set. The field factor β is thus determined by repetitive fitting approximations. K can be determined from electron trajectory simulation as described above, and a relationship for β as a function of K can be determined. Using this method, applicants derived the following equation for β(K): β(K)=1.13×$10^8$ $K^{-0.826}$, with β in units 1/m and K in units nm. The constants 1.13×$10^8$ and −0.826 were derived as described above for a particular source configuration and the calculation of β was unexpectedly found to be accurate for emitters of different conditions. That is, the field factor curve, once determined for a source geometry or configuration, was found to be accurate even as the emitter changes over time and progresses through the known stages.

Based upon the methods described herein, skilled persons would be able to calculate the constants for different source geometries, such as different emitter-extractor distances. In one technique, for example, the trajectories of electrons at different extractor voltages are modeled by a simulation, and then the electric field that corresponds to those trajectories is determined. K can be determined from electron trajectories, while β can be determined from the ratio of the simulated field to the voltage. This is repeated for different emitter shapes, for different K and β, to provide a curve. A variety of emitter shapes can be modeled to determine K and β for different emitter shapes by simulating the launching of electrons and calculating the electron trajectories and finding fields. Comparing β at different values of K produces the relationship of β as a function of K used in step 202. Different constants are thereby determined for the equations used in FIG. 2, and the method of FIG. 2 can then be applied to different emitter configurations.

FIG. 3 shows a graph of β versus K at different emitter stages, each point determined by the curve fitting method described above. FIG. 3 shows that a single curve fits the points of all three different emitter stages, that is, β is independent of the emitter shape. This shows that it is unnecessary to know the shape of the emitter to determine β and therefore, to determine the other emission parameters. The equation that describes the best curve fit to the scatter in FIG. 3 determines the constants of the equation described above used in step 202. FIG. 3 itself could also be used to determine β in step 202, although this is not a preferred method of determining β.

In step 204, an intrinsic energy spread of the beam, $\Delta_E$(int), is calculated using basic emitter equations, such as those described in Bahm et al., "Range of Validity of Field Emission Equations," J. Vac. Sci. Technol. B 26 (6) pp. 2080-2084 (2008) and in Modinos, *Field Thermionic and Secondary Electron Emission Spectroscopy* (Plenum Press, N.Y., 1984). Current density J is also calculated from β and the work function as described above.

Figure 8:
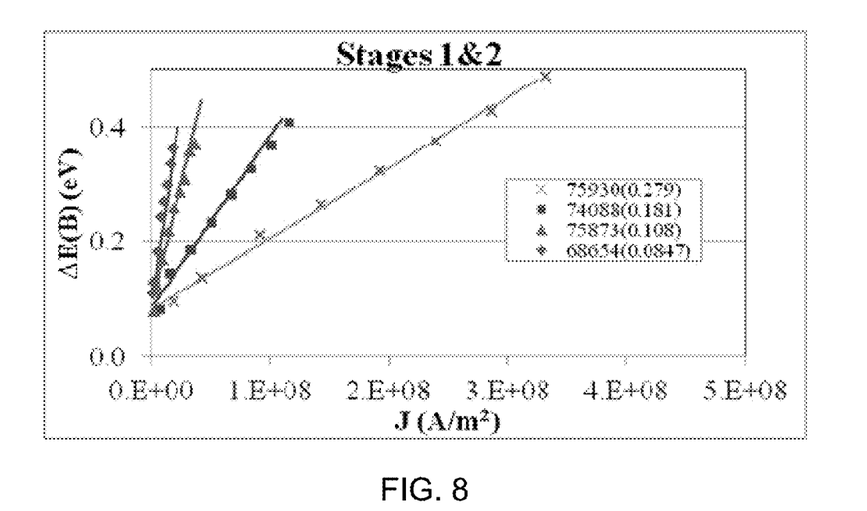
FIG. 8 shows a plot of the Boersch contribution to the total energy spread $\Delta E(B)$ as a function of current density.

In step 206 an energy spread correction factor, $\Delta_E$(B), is calculated. The factor is calculated using a relationship, $\Delta_E(B)=6.9\times10^{-11}$ J $\beta^{-2.19}$+0.088, which has been determined from a comparison of experimental energy distributions width values and the intrinsic energy spread values to which they correspond. The correction factor is the unique non-negative number which, when combined in quadrature with the intrinsic energy spread $\Delta_E$(int), gives the corrected energy spread $\Delta_E$. FIG. 8 shows a plot of the Boersch contribution to the total energy spread ΔE(B) in electron volts as a function of current density in amps per meter squared for four different emitter configurations. The plot in FIG. 8 shows the linear dependence of an energy spread correction factor on the source current density J for a collection of emitters over a range of operating conditions. The slope of each curve is set by a constant of proportionality which has a power law type dependence on the field factor β, namely 8.05×$10^{-11}$ $\beta^{-0.826}$. The parenthetical values in the legend give the β value corresponding to the particular source identification number.

In step 208, the intrinsic energy spread is convolved in quadrature with the energy spread correction factor to provide the corrected energy spread according to the relationship $\Delta_E=(\Delta_E(int)^{1.67}\Delta_E(B)^{1.67})^{1/1.67}$. The exponents of 1.67 have been determined by the best fit to the experimental data and are independent of the emitter configuration.

In step 210, the intrinsic brightness, $B_r$(int), is calculated using the relationship $B_r$(int)=1.44 J/(πk T) which has been described previously. The coefficient 1.44 is derived from the physics of a point source and is independent of the emitter configuration. In step 212, the corrected brightness, $B_r$, is calculated as a quadratic function of the intrinsic brightness according to the relationship $B_r=-1.45\times10^{-10} B_r(int)^2+0.792 B_r(int)$. The choice of constants in this quadratic expression have been determined by curve fit to a plot of corrected brightness versus intrinsic brightness as shown in FIG. 9, which shows a plot of the reduced brightness $B_r$ versus the intrinsic $B_r$(int) without Coulomb interactions as determined by particle tracking simulations. FIG. 9 shows that the points for different emitter stages fall along the same line. The particular values of the constants in this equation therefore depend on the details of the extraction configuration but not on the tip shape or state. Skilled persons will recognize that adjustments to the constants may be required in case of a different extraction configuration, but that such adjustments do not depart from the invention.

In step 214, the virtual source size $d_v$ is determined from the corrected brightness by the relationship $d_v = (4 \text{ K}^2 \text{ J}/(\pi B_r V_{ext}))^{1/2}$. This relationship can be derived with an algebraic manipulation of the definition for brightness described above.

Knowing the various emission parameters, including the reduced brightness, the energy spread, and the virtual source size, an operator can decide in decision block 220 whether any action is required. If no action is required, the operator can operate the electron source for a period of time in block 222 before checking the emission quality at a future time by repeating the process from block 200. If the operator sees that the emission characteristics have changed or that they are not optimum, the operator can take action in step 224. For example, the operator may determine from one measurement or from a series of measurements that the source is degrading and schedule a replacement. A series of measurements that shows the emitter characteristics changing over time can provide an estimate of the remaining life of the emitter.

In some cases, an operator can adjust the operation of the source and/or of the electron column based on the condition of the emitter. An operator can maximize performance over the microscope over the life of the source. For example, it is typically desirable to maintain a desired spot size at the sample. If the energy spread has increased, the spot size will become larger due to the increased effects of chromatic aberrations in the focusing system. The spot size may be reduced by reducing the angular intensity of the emitter by reducing the extractor voltage. Changing the focal length of the column lenses will also affect the chromatic aberration and may be used to compensate, to some extent, for an increased energy spread. If the calculations in FIG. 2 show a decrease in the reduced brightness, the reduction may be compensated by increasing the extraction voltage to provide additional current in the beam.

The flowchart in FIG. 2B shows an alternative embodiment of the invention. Steps 200, 202, and 204 have been described above. In step 230, the intrinsic virtual source size is calculated from K, the source temperature T, and the extraction voltage V. The relationship between the intrinsic virtual source size and K is known and described, for example, *Handbook of Charged Particle Optics*, cited above. One embodiment uses an equation of the form $d_v(\text{int}) = 1.67 \text{ (K)} (kT/V_{ext})^{1/2}$ in which $d_v(\text{int})$ is the intrinsic virtual source size, k is the Boltzmann constant, and, as described above, K is the square root of the ratio I'/J, T is the temperature of the source, and $V_{ext}$ is the extractor voltage.

In step 232, a corrected virtual source size is determined from the intrinsic virtual source size. FIG. 4 shows the ratio of $d_v/d_v(\text{int})$ plotted against J. The data points of FIG. 4 are determined by trajectory modeling or of trajectory measurements. The data is fit by an equation in form of $d_v = (C_2 J^2 + C_1 J + C_0) d_v(\text{int})$. The constants "$C_0$", "$C_1$", and "$C_2$" are determined by fitting the data points to a curve; in one source configuration, they were found to have values 0.97, 9.3×$10^{-10}$, and $-3.4 \times 10^{-19}$, respectively, when J was expressed in the SI units Amperes per square meter. Because all points for different emitter points fall on the same curve, FIG. 4 shows again that the relationship between $d_v$ and $d_v(\text{int})$ is independent of the stage of the emitter.

In optional step 234, the angular intensity is calculated from the current density and K, using the expression $I' = J(K)^2$.

Step 234 functions as a check on the previous calculation. The calculated angular intensity should be the same as the angular intensity measured in step 200, preferably within five percent and more preferably within one percent. If the calculated angular intensity does not agree with the measured current density from step 200, earlier curve-fitting steps are repeated to more accurately determine the field factor.

In step 236, a corrected energy spread $\Delta_E$ of the emitter is calculated from $\Delta_E(\text{int})$. To determine the relationship of $\Delta_E$ and $\Delta_E(\text{int})$, $\Delta_E$ is measured at a variety of angular intensities, and $\Delta_E(\text{int})$ is calculated for those angular intensities. The ratio of $\Delta_E$ to $\Delta_E(\text{int})$ is plotted against the angular intensity and resultant curve is fitted to a polynomial equation in I'. The coefficients of the polynomial equation are determined by finding coefficients that provide the best fit of the curve to the data. FIG. 5 shows a graph of $\Delta_E/\Delta_E(\text{int})$ plotted against I' for a particular source configuration. The best fit polynomial function for the data is FIG. 5 was found to be $\Delta_E = (-0.37 I'^2 + 1.16 I' + 1.06) \Delta_E(\text{int})$. Applicants found unexpectedly that the coefficients remain relatively constant for a particular source geometry, even as the emitter conditions changes over time or with different emitters. That is, the relationship between $\Delta_E$ and $\Delta_E(\text{int})$ is independent of the stage of the emitter. The relationship therefore remains valid and provides information about the energy spread throughout the useful life of the emitter.

Some users prefer to characterize source emissions using reduced brightness, defined as current divided by normalized emittance. In step 238, a reduced brightness is calculated using the relationship $B_r = 4 I' / (\pi d_v^2 V_{ext})$ which includes values calculated previously for $d_v$ in step 232.

Steps 220, 222, and 224 are the same as those described above with respect to FIG. 2A.

Figure 10:
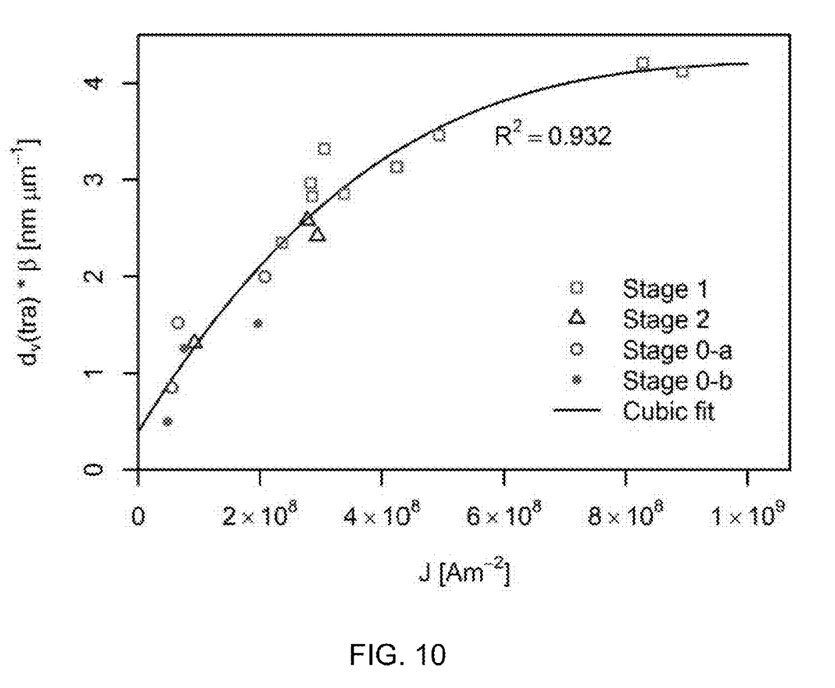
FIG. 10 shows $\beta$ times the trajectory displacement contribution to the virtual source size, $d_v(tra)$, plotted as a function of current density.

The flowchart in FIG. 2C shows an alternative embodiment of the invention. Steps 200, 202, 204, and 230 have been described above. In step 240, a correction factor for growth in the virtual source size due to trajectory displacements, $d_v(\text{tra})$, is calculated using a third-order polynomial equation involving the calculated current density J and the calculated field factor β, namely $d_v(\text{tra}) = (3 \times 10^{-27} J^3 + 1 \times 10^{-17} J^2 + 1 \times 10^{-8} J + 0.4)/\beta$. FIG. 10 shows the product of trajectory displacement times β plotted against current density in amps per meter squared for the same emitters shown in FIG. 9. The solid black curve in FIG. 9 shows the third-order polynomial equation, which resembles the scatter quite well. It was determined that the relationship $d_v(\text{tra}) = (3 \times 10^{-27} J^3 + 1 \times 10^{-17} J^2 + 1 \times 10^{-8} J + 0.4)/\beta$ obtained for all emitters in the specific source geometry, regardless of emitter Stage or operating condition. Persons skilled in the art will appreciate that slight modifications to this relationship will be required in order to extend its applicability to other source geometries.

In step 242, the corrected virtual source size is computed using $d_v = (d_v(\text{int})^2 + d_v(\text{tra})^2)^{1/2}$, i.e. by the addition in quadrature of the intrinsic and trajectory displacement contributions to the virtual source size.

Steps 206, 208, 236, and beyond have been described previously.

As described above, the constants used in calculations in the steps of FIGS. 2A-2C are valid for specific source geometry. The constants are determined depending upon the source geometry, such as the emitter to extractor distance, the protrusion of the emitter above the suppressor cap, and the position of the apertures. The steps of FIGS. 2A-2C use a combination of experimental data and modeling data to create critical fits, and the steps apply to almost any shape and size of emitter. From the field factor, one can determine all the critical parameters. It is not necessary to determine or to know the microgeometry of the emitter.

Many of the characteristics of the source or the beam may be defined in different ways, and the invention is not limited to any particular definition. For example, while the examples use FW50 as measurement of emission energy spread, other measurements, such as a specified number of standard deviations of the Gaussian energy distribution or the width of the energy distribution curve falls to ½ of the maximum value (FWHM), can be also used. The brightness parameter used can be a reduced brightness, defined as current divided by normalized emittance, or the embodiments can use other brightness measurement definitions.

Figure 6:
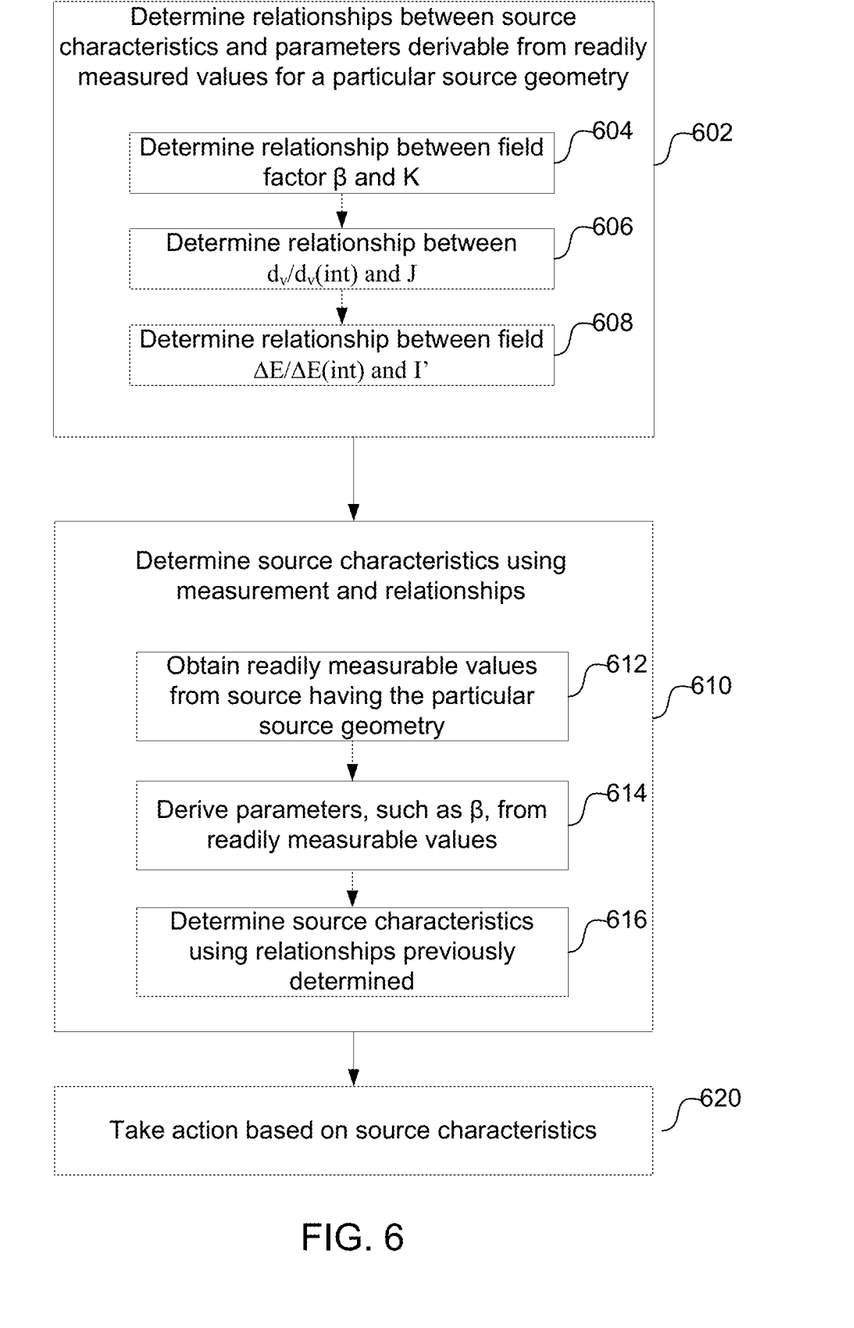
FIG. 6 shows a flow chart of a method of the invention.

FIG. 6 summarizes an embodiment of the invention. In block 602, relationships are determined between source characteristics and parameters derivable from readily measured values for a particular source geometry. This can entail, for example, determining a relationship between field factor β and K in block 604, determining a relationship between $d_v/d_v$ (int) and J in block 606, and determining a relationship between field $\Delta_E/\Delta_E$(int) and I' in block 608. As described above and shown in FIGS. 3-5, these relationships can be determined by plotting values determined from experiments, simulations, and basic emitter theory. Once these relationships are determined for a particular source configuration, they can be used by an operator to determine characteristics of the source from measured data in block 610.

In block 612, readily measurable values are obtained from a source having the same geometry as the source in block 602. For example, angular intensity may be measured at different extraction voltages. In block 614, parameters, such as β, K, and φ, are derived from the measured values. In block 616, source characteristics are determined using the relationships from block 602, the measurements from block 612, and the parameters from block 614. In step 620, an operator can take action, such as optimizing the column, replacing the source, or scheduling maintenance, based on the determined source characteristics.

Figure 7:
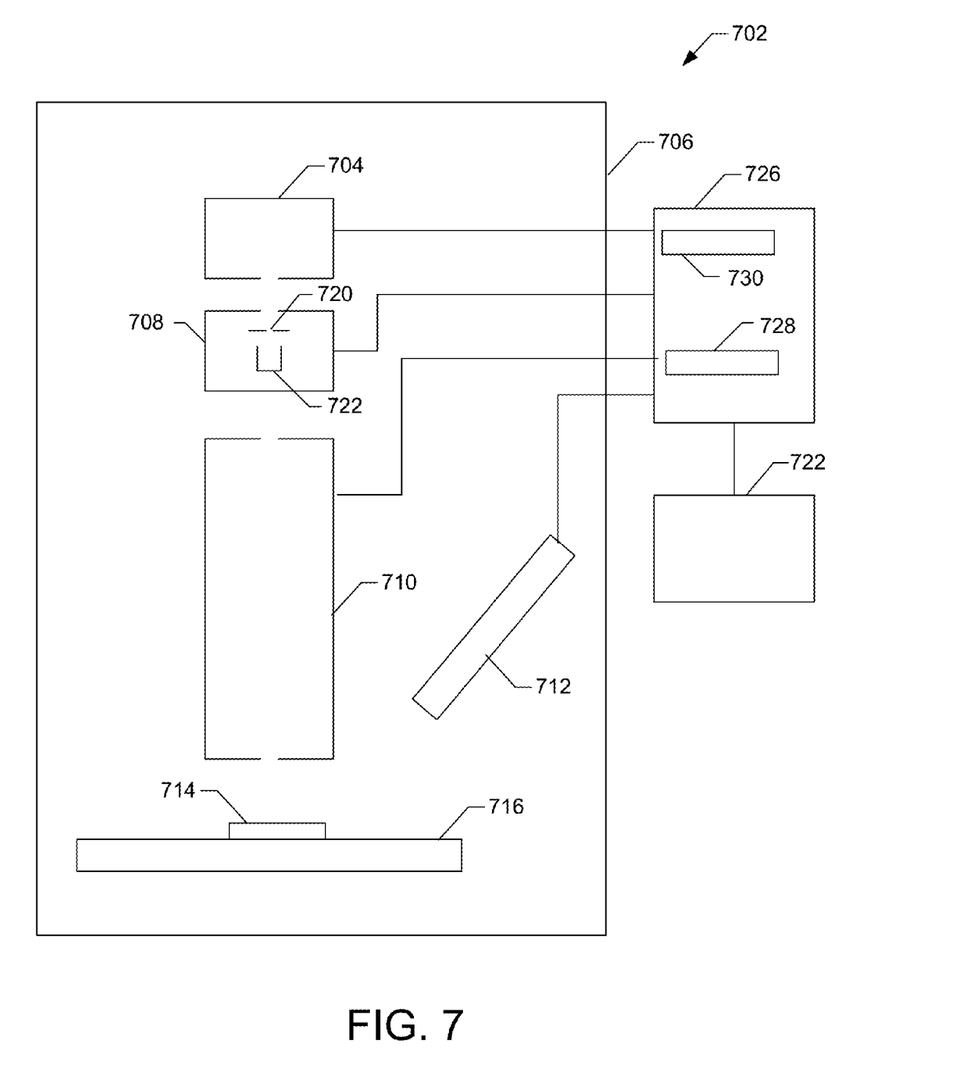
FIG. 7 shows an electron beam system containing the invention

FIG. 7 shows a block diagram of an electron beam system 702, such as a scanning electron microscope, that incorporates a field emission electron source 704 within a vacuum chamber 706. Electron beam system 702 also includes an insertable angular intensity measurement device 708, an electron column 710, a secondary particle detector 712, and a specimen 714 on a stage 716. An angular intensity measurement device 708 typically includes an aperture 720 and a Faraday cup 722, but other configurations can also be used. Measurement device 708 is inserted into the path of the electron beam for characterizing the emission of the source or removed from the path for normal electron beam operation. Insertion and removal may be manual or automatic.

A controller 726 controls some or all of the components in the system 702, either automatically, through operator instructions, or through a combination of both. Some of the method steps may be performed manually without using controller 726. For example, if it is determined in step 220 that any action is required, controller 726 may perform the action or alert the operator to perform the operation. Controller 726 typically carries out the computational steps in FIG. 2.

Controller 726 typically includes a processor 728, such as a microprocessor, micro-controller, or programmable array of logic, and memory 730 that stores computer readable instructions and data. Controller 726 as used herein may comprise multiple devices, such as a personal computer and a processor embedded in the system 702, and steps of described above may be performed on either or both. Embodiments of the invention can also include a computer readable media storing instructions for carrying out one or more of the instructions of FIG. 2. In normal operation, the electron beam is directed toward specimen 714 by controller 726 or manually, and an image of the work piece is displayed on a display 722 using secondary particles detected by detector 712. Electron beam system 702 is provided by way of example, and systems in accordance with the invention are not limited in their application to the configuration shown.

Quite surprisingly, the authors have found that the reduced brightness for an emitter is well-characterized by a quadratic function of the intrinsic reduced brightness, regardless of emitter Stage or operating condition. FIG. 9 shows a scatter plot of the reduced brightness for a collection of emitters of all end-form Stages plotted as a function of the intrinsic reduced brightness. An excellent agreement with a second-order polynomial law has been obtained.

FIG. 10 shows β times the trajectory displacement contribution to virtual source size, plotted as a function of the emitter current density.

It should be recognized that embodiments of the present invention can be implemented via computer hardware or software, or a combination of both. The methods can be implemented in computer programs using standard programming techniques—including a computer-readable storage medium configured with a computer program, where the storage medium so configured causes a computer to operate in a specific and predefined manner—according to the methods and figures described in this specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, sensors, and the like. Aspects of the present invention may be implemented in machine readable code stored as memory on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as aberration correctors or to a display monitor. In preferred embodiments of the present invention, the transformed data represents physical and tangible objects, and embodiments can produce a particular visual depiction of the physical and tangible objects on a display.

Preferred embodiments of the present invention may make use of a particle beam apparatus, energy beam apparatus, or apparatus using a physical probe tip in order to image a sample. Such beams or physical probes used to image a sample inherently interact with the sample resulting in some degree of physical transformation. Further, throughout the present specification, discussions utilizing terms such as "calculating," "determining," "measuring," "generating," "detecting," "forming," "resetting," "reading," "subtracting," "detecting," "comparing," "acquiring," "mapping," "recording," "transforming," "changing," or the like, also refer to the action and processes of a computer system, a sensor, or similar electronic device, that manipulates and transforms data represented as physical quantities within the computer system into other data similarly represented as physical quantities within the computer system or other information storage, transmission or display devices.

The invention has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for carrying out some embodiments of the present invention are commercially available, for example, from FEI Company, the assignee of the present application.

Further, whenever the terms "automatic," "automated," or similar terms are used herein, those terms will be understood to include manual initiation of the automatic or automated process or step. In the following discussion and in the claims, the terms "including" and "comprising" are used in an open-ended fashion, and thus should be interpreted to mean "including, but not limited to . . . ."

To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions, and alterations can be made herein without departing from the scope of the invention as defined by the appended claims. Not all parameters and characteristics of the source are calculated in every embodiment. Different embodiments may measure different measurement parameters and calculate different derived parameters. The invention may be applicable to field emission ion sources as well as electron sources. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of determining emission characteristics of a field electron source, comprising:

sequentially extracting electrons from the field electron source using different extraction voltages;

measuring the electron current at the multiple extraction voltages to determine a relationship between an angular intensity I' and the extraction voltage;

determining, from the relationship and beam geometry, work function and field factor $\beta$ corresponding to a ratio of the applied electric field at the emission surface and the extraction voltage;

determining an emission current density J from the angular intensity and beam geometry, J being defined at the emitter surface location;

determining an intrinsic emission energy spread from the field factor, the extraction voltage, the work function, and the source temperature;

determining an intrinsic virtual source size $d_v(int)$ from the beam geometry, source temperature, and extraction voltage;

determining a corrected emission energy spread from the intrinsic emission energy spread and the angular intensity;

determining a corrected virtual source size $d_v$ from the emission current density; and determining a beam brightness from the angular intensity, the corrected virtual source size, and the extraction voltage.

2. The method of claim 1 in which determining a beam brightness includes determining a reduced beam brightness.

3. The method of claim 1 in which measuring the electron current at the multiple extraction voltages to determine a relationship between an angular intensity and the extraction voltage includes directing an electron beam through an aperture having a known diameter and into a Faraday cup.

4. The method of claim 1 in which the field factor $\beta$ is determined as a function of the form A times $K^B$, where K is the square root of the ratio I'/J, A and B being determined by the source configuration and being relatively independent of the emitter condition.

5. The method of claim 1 in which determining the corrected virtual source size $d_v$ includes determining the corrected virtual source size $d_v$ as a function in the form of (DJ+1) times the intrinsic virtual source size $d_v(int)$, where D is a constant and J is the emission current density, $d_v(int)$ being found by the well-known expression CK $(kT/V_{ext})^{1/2}$, where C is a constant, K is the square root of the ratio I'/J, k is Boltzmann's constant, T is the temperature of the emitter and $V_{ext}$ is the extractor voltage.

6. The method of claim 1 in which determining the corrected virtual source size $d_v$ includes determining the corrected virtual source size $d_v$ as a function in the form $d_v=(d_v(int)^2+d_v(tra)^2)^{1/2}$, where dv(int) is the intrinsic virtual source size and $d_v(tra)$ is a virtual source size broadening term which corrects for trajectory defects due to Coulombic interactions in the beam, $d_v(tra)$ being a function of the field factor $\beta$ and the emission current density.

7. The method of claim 1 further comprising calculating the angular intensity as the current density times K squared, and comparing the calculated angular intensity to the measured angular intensity.

8. The method of claim 7 further comprising recalculating the field factor if the calculated angular intensity varies from the measured angular intensity by more than 5%.

9. The method of claim 1 further comprising adjusting an optical element of a focusing column based on source emission characteristics.

10. The method of claim 9 wherein adjusting an optical element includes adjusting the extractor voltage, suppressor voltage, or emitter temperature.

11. The method of claim 1 further comprising removing an emitter from service based on the calculated emission energy spread, the calculated brightness, or the derived virtual source size.

12. A method of determining from measurements of beam properties, characteristics of an electron source that uses field emission in an electron beam system, comprising:
varying an extractor voltage applied to the field emission electron source and measuring one or more characteristics of the emission at different extraction voltages;
determining a relationship between the extraction voltage and one or more of the measurement characteristics;
calculating from the relationship a field factor β corresponding to a ratio of the applied electric field and the extraction voltage, the calculation including an expression of the form $AK^X$, where A and X are functions of the source geometry and are independent of the emitter tip condition; and
determining from the field factor at least one additional derived characteristic of the source.

13. The method of claim 12 further comprising altering the electron beam system in response to the value of one of the additional derived characteristics of the source to maintain a desired operating characteristic of the electron beam system.

14. The method of claim 12 in which the at least one additional derived characteristic is corrected for columbic interactions within the beam.

15. The method of claim 12 in which determining at least one additional derived characteristic includes determining a beam brightness, a virtual source size, or an emission energy spread.

16. The method of claim 12 in which determining a relationship between the extraction voltage and the measurement characteristics includes determining the relationship between angular intensity and extraction voltage.

17. The method of claim 16 in which determining from the field factor at least one additional derived characteristics of the source includes determining an intrinsic virtual source size $d_v(int)$ using a relation including a factor that is a function of the source geometry and that is independent of the emitter condition.

18. The method of claim 17 further comprising determining a virtual source size corrected for Coulombic interactions from the intrinsic virtual source size and the emission current density multiplied by a second factor that is a function of the source geometry and that is independent of the emitter condition.

19. The method of claim 16 in which determining from the field factor at least one additional derived characteristic includes determining an emission energy spread.

20. The method of claim 19 in which determining a emission energy spread includes determining a emission energy spread corrected for Coulombic interactions from an uncorrected emission energy spread and a correction factor including the angular intensity times a factor that is a function of the source geometry and that is independent of the emitter condition.

21. The method of claim 20 in which the correction factor is includes a power series of I', the coefficient of the power series being functions of the source geometry and independent of the emitter condition.

22. The method of claim 19 in which determining a emission energy spread includes determining a emission energy spread corrected for Coulombic interactions from an uncorrected emission energy spread and a correction factor which includes a product of the emission current density and a power of the field factor.

23. The method of claim 16 in which determining from the field factor at least one additional derived characteristic includes determining a reduced beam brightness either from the angular intensity, the virtual source size, and the extraction voltage or from the temperature and emission current density.

24. The method of claim 23 in which determining a reduced beam brightness includes determining a reduced beam brightness which is corrected for Coulombic interactions.

25. The method of claim 24 in which where the corrected reduced beam brightness is a polynomial expansion of the uncorrected reduced beam brightness.

26. An electron beam apparatus, comprising:
a field emission electron source;
a measurement device for determining the angular intensity of the electrode beam;
a processor for:
determining a field factor β corresponding to a ratio of the applied electric field at the emission surface and the extraction voltage;
determining an intrinsic emission energy spread from the field factor, an extraction voltage, a work function, and a source temperature;
determining an intrinsic virtual source size $d_v(int)$ from the beam geometry, source temperature, and extraction voltage;
determining a corrected emission energy spread from the intrinsic emission energy spread and the angular intensity;
determining a corrected virtual source size $d_v$ from the current density; and
determining a beam brightness from the angular intensity, the corrected virtual source size, and the extraction voltage.

27. A non-transitory computer readable media comprising stored computer instructions for:
determining a field factor β corresponding to a ratio of the applied electric field at the emission surface and the extraction voltage;
determining a source region lens factor corresponding to the ratio of the angular intensity to the current density at the emission surface;
determining an intrinsic emission energy spread from the field factor, an extraction voltage, a work function, and a source temperature;
determining an intrinsic virtual source size $d_v(int)$ from the source region lens factor, source temperature, and extraction voltage;
determining a corrected emission energy spread from the intrinsic energy spread and the angular intensity;
determining a corrected virtual source size $d_v$ from the current density; and
determining a beam brightness from the angular intensity, the corrected virtual source size, and the extraction voltage.

* * * * *